United States Patent
Hou et al.

(10) Patent No.: US 12,355,562 B2
(45) Date of Patent: Jul. 8, 2025

(54) CHANNEL REENCODING TO REDUCE INVALID PHYSICAL DOWNLINK CONTROL CHANNEL SIGNALS

(71) Applicant: VIAVI Solutions Inc., Chandler, AZ (US)

(72) Inventors: Jiancao Hou, Surbiton (GB); Wei Li, Stevenage (GB); Matthew David Brown, Hants (GB); Chi-ming Leung, Hardwick (GB)

(73) Assignee: VIAVI Solutions Inc., Chandler, AZ (US)

( * ) Notice: Subject to any disclaimer, the term of this patent is extended or adjusted under 35 U.S.C. 154(b) by 442 days.

(21) Appl. No.: 18/048,809

(22) Filed: Oct. 21, 2022

(65) Prior Publication Data

US 2024/0137153 A1 Apr. 25, 2024
US 2024/0235734 A9 Jul. 11, 2024

(51) Int. Cl.

| | |
|---|---|
| *H04L 1/00* | (2006.01) |
| *H03M 13/13* | (2006.01) |
| *H03M 13/37* | (2006.01) |
| *H04L 1/20* | (2006.01) |
| *H04L 1/24* | (2006.01) |

(52) U.S. Cl.
CPC ............ *H04L 1/0038* (2013.01); *H04L 1/208* (2013.01); *H04L 1/24* (2013.01); *H03M 13/13* (2013.01); *H03M 13/3776* (2013.01); *H04L 1/0054* (2013.01); *H04L 1/0061* (2013.01)

(58) Field of Classification Search
None
See application file for complete search history.

(56) References Cited

U.S. PATENT DOCUMENTS 11,206,656 B2 12/2021 Li et al.
2022/0190959 A1* 6/2022 Hwang ................... H04L 1/005

OTHER PUBLICATIONS

Arikan et al., "Channel polarization: A method for constructing capacity-achieving codes for symmetric binary-input memoryless channels," IEEE Trans. on Inf. Theory, vol. 55, No. 7, Jul. 2009, 23 Pages.
Mori et al., "Performance of Polar Codes with the Construction using Density Evolution," IEEE Communications Letters, vol. 13, No. 7, Jul. 2009, 3 Pages.
(Continued)

*Primary Examiner* — Walter J Divito
(74) *Attorney, Agent, or Firm* — Harrity & Harrity, LLP

(57) ABSTRACT

A device may receive a PDCCH signal, may decode encoded bits of the PDCCH signal to generate coded bits, may reencode the coded bits, and may calculate a detection error probability of each coded bit at an output of soft demodulation. The device may calculate a channel decoding error probability that cyclic redundancy check bits are still attached to the coded bits, and may calculate an error probability of channel reencoding, of each coded bit, due to error propagation of polar decoding and reencoding. The device may calculate a probability density of a BMR associated with the coded bits, and may calculate a threshold based on the detection error probability, the channel decoding error probability, the error probability of channel reencoding, and the probability density of a BMR. The device may determine that the PDCCH signal is invalid based on the BMR being greater than the threshold.

20 Claims, 11 Drawing Sheets

(56) References Cited

OTHER PUBLICATIONS

Mori et al., "Performance and Construction of Polar Codes on Symmetric Binary-Input Memoryless Channels," Proc. IEEE Symp. Info. Theory, Seoul, Korea, 2009, 5 Pages.

Trifonov et al., "Efficient Design and Decoding of Polar Codes," IEEE Transactions on Communications, vol. 60, No. 11, Nov. 2012, 7 Pages.

Wu et al., "Construction and Block Error Rate Analysis of Polar Codes Over AWGN Channel Based on Gaussian Approximation," IEEE Communications Letters, vol. 18, No. 7, Jul. 2014, 4 Pages.

Babar et al., "Polar Codes and Their Quantum-Domain Counterparts," IEEE Communications Surveys & Tutorials, vol. 22, No. 1, 2020, 33 Pages.

"5G; NR; Physical channels and modulation (3GPP TS 38.211 version 15.2.0 Release 15)," ETSI TS 138 211 V15.2.0, Jul. 2018, 98 Pages.

"5G; NR; Multiplexing and channel coding (3GPP TS 38.212 version 15.11.0 Release 15)," ETSI TS 138 212 V15.11.0. Aug. 2021, 106 Pages.

Extended European Search Report for European Application No. EP23204902 dated Sep. 29, 2024, 9 pages.

Ju, H., et al., "Path-Metric-Based False Alarm Reduction in Blind Detection of Polar Codes" Ieee Wireless Communications and Networking Conference (WCNC), IEEE, May 25, 2020, pp. 1-6, XP033782752, DOI: 10.1109/WCNC45663.2020.9120665.

Sun, H., et al., "Efficient Blind Detection Scheme Based on Simplified Decoding of Polar Codes", Ieee Wireless Communications Letters, IEEE, Piscataway, NJ, USA, vol. 10(4), Dec. 28, 2020, pp. 864-868, XP011848817, ISSN: 2162-2337, DOI: 10.1109/LWC.2020.3047809.

Sun, H., et al., "Significance Test Based Blind Detection for 5G", IEEE Transactions on Vehicular Technology, vol. 71 (7), Apr. 11, 2022, pp. 7957-7962, XP011914361, ISSN: 0018-9545, DOI: 10.1109/TVT.2022.3166546.

\* cited by examiner

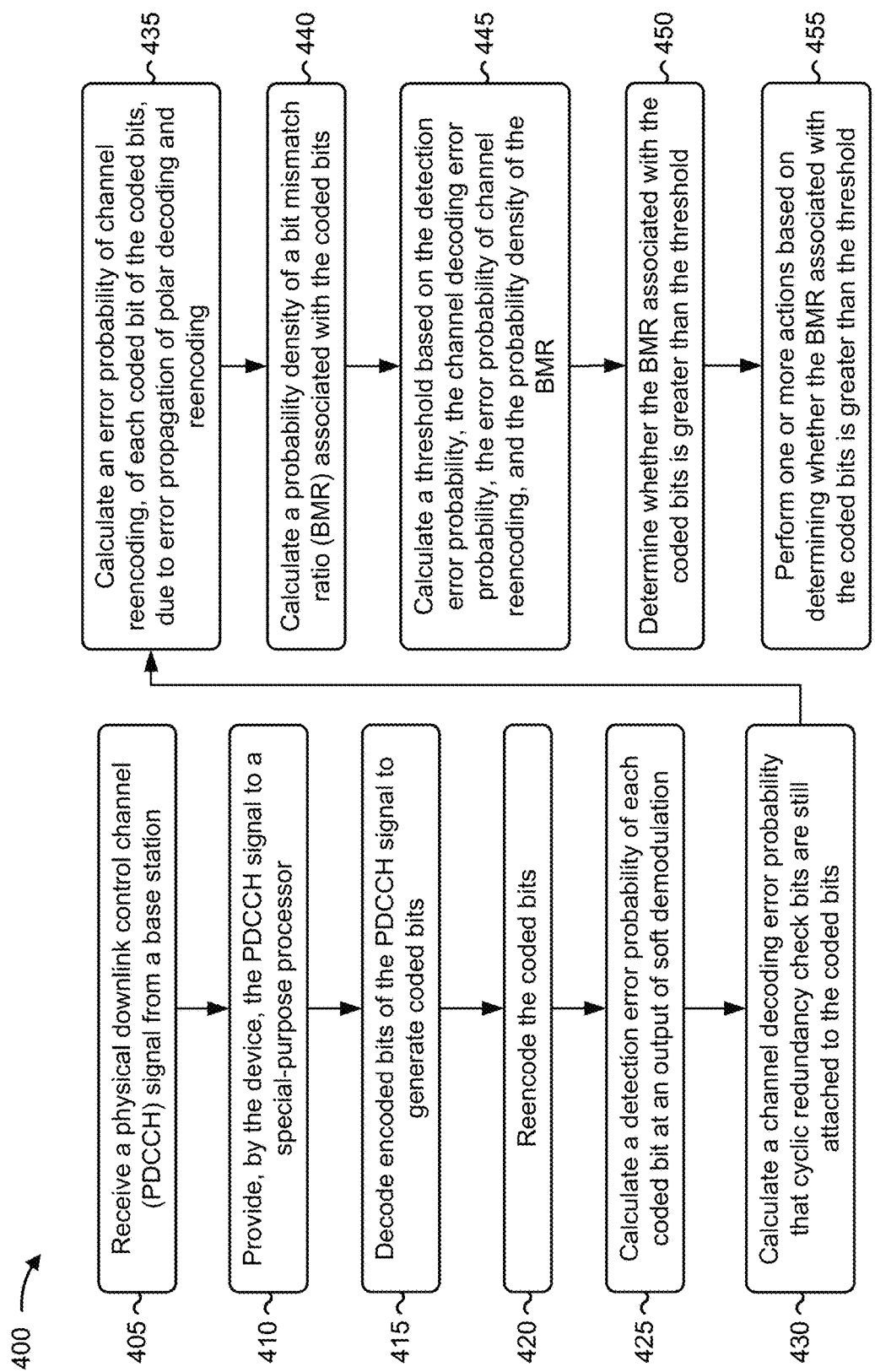

CHANNEL REENCODING TO REDUCE INVALID PHYSICAL DOWNLINK CONTROL CHANNEL SIGNALS

BACKGROUND

Accelerating decoding processes to extract valid operational information is critical to achieving ultra-reliable and low latency communications (URLLC) for a normal user equipment (UE) and/or an efficient multi-UE testing system.

SUMMARY

Some implementations described herein relate to a method. The method may include receiving a physical downlink control channel (PDCCH) signal from a base station, and providing the PDCCH signal to a special-purpose processor of the device. The method may include decoding, by the special-purpose processor, encoded bits of the PDCCH signal to generate coded bits, and reencoding, by the special-purpose processor, the coded bits. The method may include calculating a detection error probability of each coded bit at an output of soft demodulation, and calculating a channel decoding error probability that cyclic redundancy check bits are still attached to the coded bits. The method may include calculating an error probability of channel reencoding, of each coded bit of the coded bits, due to error propagation of polar decoding and reencoding, and calculating a probability density of a bit mismatch ratio associated with the coded bits. The method may include calculating a threshold based on the detection error probability, the channel decoding error probability, the error probability of channel reencoding, and the probability density of a bit mismatch ratio, and determining, by the special-purpose processor, whether the bit mismatch ratio associated with the coded bits is greater than the threshold. The method may include performing one or more actions based on determining whether the bit mismatch ratio associated with the coded bits is greater than the threshold.

Some implementations described herein relate to a device. The device may include one or more memories and one or more processors coupled to the one or more memories. The one or more processors may be configured to receive a PDCCH signal from a base station, and provide the PDCCH signal to a special-purpose processor of the device. The one or more processors may be configured to decode encoded bits of the PDCCH signal to generate coded bits, and reencode the coded bits. The one or more processors may be configured to calculate a detection error probability of each coded bit at an output of soft demodulation, and calculate a channel decoding error probability that cyclic redundancy check bits are still attached to the coded bits. The one or more processors may be configured to calculate an error probability of channel reencoding, of each coded bit of the coded bits, due to error propagation of polar decoding and reencoding, and calculate a probability density of a bit mismatch ratio associated with the coded bits. The one or more processors may be configured to calculate a threshold based on the detection error probability, the channel decoding error probability, the error probability of channel reencoding, and the probability density of a bit mismatch ratio, and determine whether the bit mismatch ratio associated with the coded bits is greater than the threshold. The one or more processors may be configured to determine that the PDCCH signal is invalid based on the bit mismatch ratio being greater than the threshold, and discard the coded bits based on determining that the PDCCH signal is invalid.

Some implementations described herein relate to a non-transitory computer-readable medium that stores a set of instructions for a device. The set of instructions, when executed by one or more processors of the device, may cause the device to receive a PDCCH signal from a base station, and provide the PDCCH signal to a special-purpose processor of the device. The set of instructions, when executed by one or more processors of the device, may cause the device to decode encoded bits of the PDCCH signal to generate information bits, and reencode the information bits. The set of instructions, when executed by one or more processors of the device, may cause the device to calculate a detection error probability of each coded bit at an output of soft demodulation, and calculate a channel decoding error probability that cyclic redundancy check bits are still attached to the coded bits. The set of instructions, when executed by one or more processors of the device, may cause the device to calculate an error probability of channel reencoding, of each coded bit of the coded bits, due to error propagation of polar decoding, and calculate a probability density of a bit mismatch ratio associated with the coded bits based on the detection error probability, the channel decoding error probability, and the error probability of channel reencoding, where the probability density corresponds to a threshold. The set of instructions, when executed by one or more processors of the device, may cause the device to determine whether the bit mismatch ratio associated with the coded bits is greater than the threshold, and perform one or more actions based on determining whether the bit mismatch ratio associated with the coded bits is greater than the threshold.

BRIEF DESCRIPTION OF THE DRAWINGS

FIG. 4 is a flowchart of an example process for channel reencoding to reduce invalid PDCCH signals.

DETAILED DESCRIPTION

Figure 1A:
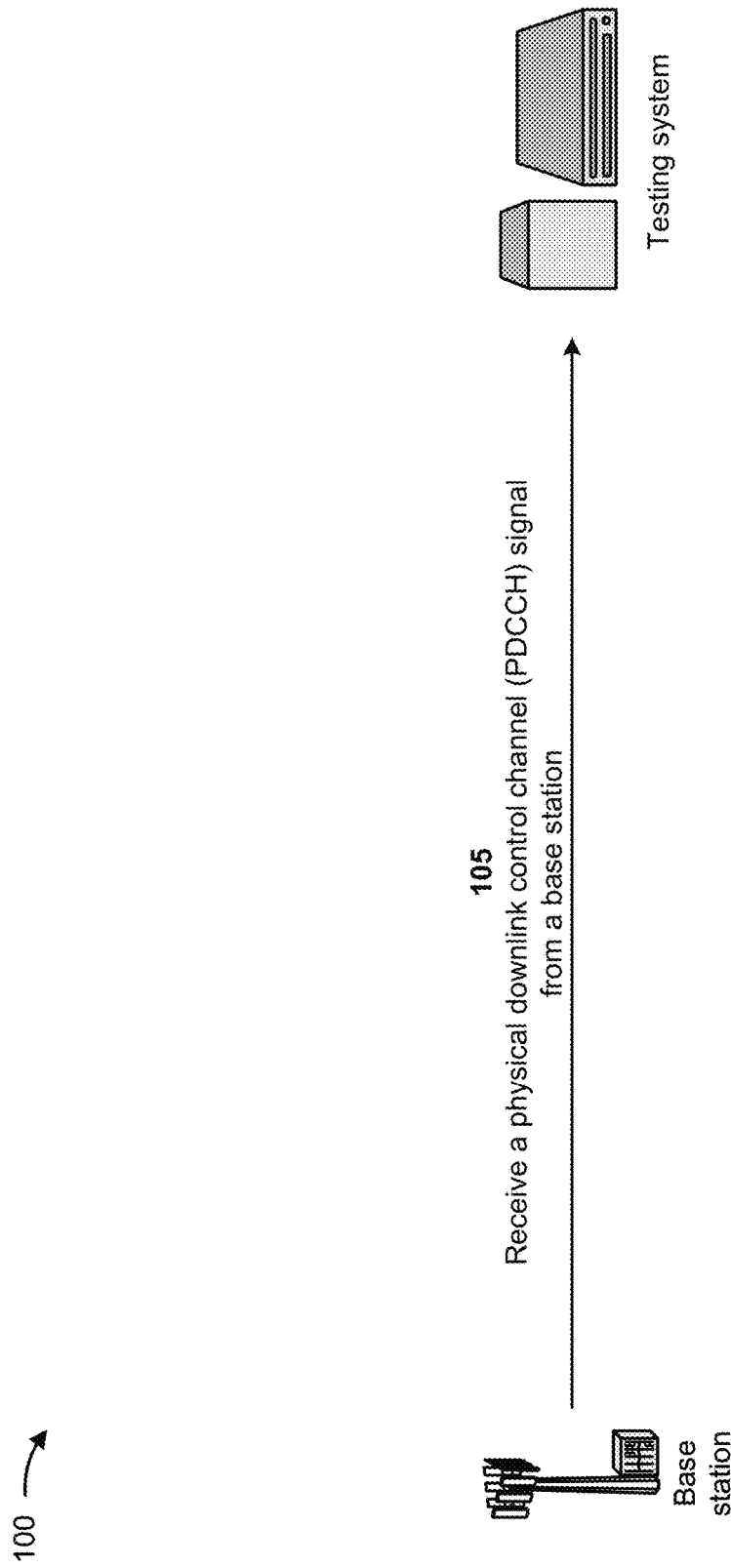
FIGS. 1A-1H are diagrams of an example implementation described herein.

The following detailed description of example implementations refers to the accompanying drawings. The same reference numbers in different drawings may identify the same or similar elements.

Among multiple bit rate processing (BRP) modules at a receiver of a testing system, decoding physical downlink control channel (PDCCH) signals via blind detection is one of the most computing resource intensive and time-consuming processing tasks. A control channel element (CCE), consisting of six resource element groups (REGs), is commonly used to carry downlink control information (DCI). Multiple CCEs (e.g., one, two, four, eight, sixteen, and/or the like) are allocated for a PDCCH candidate depending on a DCI size and channel conditions. A corresponding aggregation level (AL) is used to count a quantity of the CCEs. Although a base station may fix certain CCE indices for a particular UE (e.g., emulated by the testing system), the UE may fail to determine a specific index to start searching the quantity of consecutive CCEs or to identify a format if the format is decoded DCI. In this case, multiple blindly decoding processes are required by combining different ALs with specific starting CCE indices and DCI formats for successful DCI decoding.

A processing unit (e.g., utilized by the testing system) for blind PDCCH channel decoding may include a special-purpose processor (SPP) (e.g., a field programmable gate array (FPGA) or an application-specific integrated circuit (ASIC)) to improve computational efficiency. After channel decoding, radio network temporary identifier (RNTI) demasking and 24-bit cyclic redundancy check (CRC) checking are required for the DCI validation, which may be performed by a general-purpose processor (GPP) (e.g., utilized by the testing system), such as a digital signal processor (DSP) or a central processing unit (CPU). When testing a URLLC-enabled system, the PDCCH blind detection faces a challenge of reducing a latency of message passing between the SPP and the GPP (e.g., sending valid RNTI information to the SPP or transferring channel decoding outputs to the GPP), which would simplify the DCI verification process. Such a challenge is even more significant for a multi-UE testing system. Throughout the PDCCH decoding process, there is a possibility that partial and/or fully decoded bits are matched with bits of a valid DCI. However, when such bits are originally from noise or an interfering DCI (e.g., an invalid PDCCH candidate), a false positive results and increases the burden of message passing between the SPP and the GPP.

Therefore, current techniques for providing multi-UE testing of a base station consume computing resources (e.g., processing resources, memory resources, communication resources, and/or the like), networking resources, and/or the like associated with utilizing the computationally intensive PDCCH blind detection, creating unnecessary messaging with the PDCCH blind detection, and/or the like.

Some implementations described herein relate to a testing system that performs channel reencoding to reduce invalid PDCCH signals. For example, the testing system may receive a PDCCH signal from a base station, and may provide the PDCCH signal to an SPP of the device. The device may decode encoded information bits of the PDCCH signal to generate information bits, may reencode the information bits to generated coded bits, and may calculate a detection error probability of each coded bit at an output of soft demodulation. The testing system may calculate a channel decoding error probability that cyclic redundancy check bits are still attached to the coded bits, and may calculate an error probability, of each coded bit of the coded bits, due to error propagation of polar decoding and reencoding. The testing system may calculate a probability density of a bit mismatch ratio associated with the coded bits, and may calculate a threshold based on the detection error probability, the channel decoding error probability, the error probability of channel reencoding, and the probability density of a bit mismatch ratio. The testing system may determine whether the bit mismatch ratio associated with the coded bits is greater than the threshold, and may determine that the PDCCH signal is invalid based on the bit mismatch ratio being greater than the threshold. The device may discard the information bits based on determining that the PDCCH signal is invalid.

In this way, the testing system performs channel reencoding to reduce invalid PDCCH signals. The testing system may utilize a reencoding method to reduce a quantity of invalid PDCCH candidates before RNTI demasking and CRC checking for DCI verification, which reduces a quantity of messages passed between the SPP and the GPP and improves the blind PDCCH detection efficiency and reliability. The testing system may reencode polar decoded bits before DCI validation (e.g., the RNTI demasking and the CRC checking), and may compare the reencoded bits with a probability density of a bit mismatch ratio (BMR). If the probability density of the BMR is greater than a threshold, the testing system may consider the decoded bits an invalid PDCCH candidate. This, in turn, conserves computing resources, networking resources, and/or the like that would otherwise have been consumed in utilizing the computationally intensive PDCCH blind detection, creating unnecessary messaging with the PDCCH blind detection, and/or the like.

FIGS. 1A-1H are diagrams of an example 100 associated with channel reencoding to reduce invalid PDCCH signals. As shown in FIGS. 1A-1H, example 100 includes a base station associated with a testing system. The testing system may utilize channel reencoding to reduce invalid PDCCH signals. Further details of the base station and the testing system are provided elsewhere herein.

As shown in FIG. 1A, and by reference number 105, the testing system may receive a PDCCH signal from a base station. For example, the base station may generate the PDCCH signal. The PDCCH signal may include a signal on a physical channel that carries DCI. The PDCCH signal may include data identifying a number of the symbols (L), transport format, resource allocation, an uplink (UL) scheduling assignment (e.g., UL grants), scheduling assignments, and/or other control information. The base station may provide the PDCCH signal to the testing system, and the testing system may receive the PDCCH signal from the base station. In some implementations, the testing system may continuously receive multiple PDCCH signals from the base station, may periodically receive multiple PDCCH signals from the base station, may receive multiple PDCCH signals from the base station based on providing requests for the PDCCH signals to the base station, and/or the like.

Figure 1B:
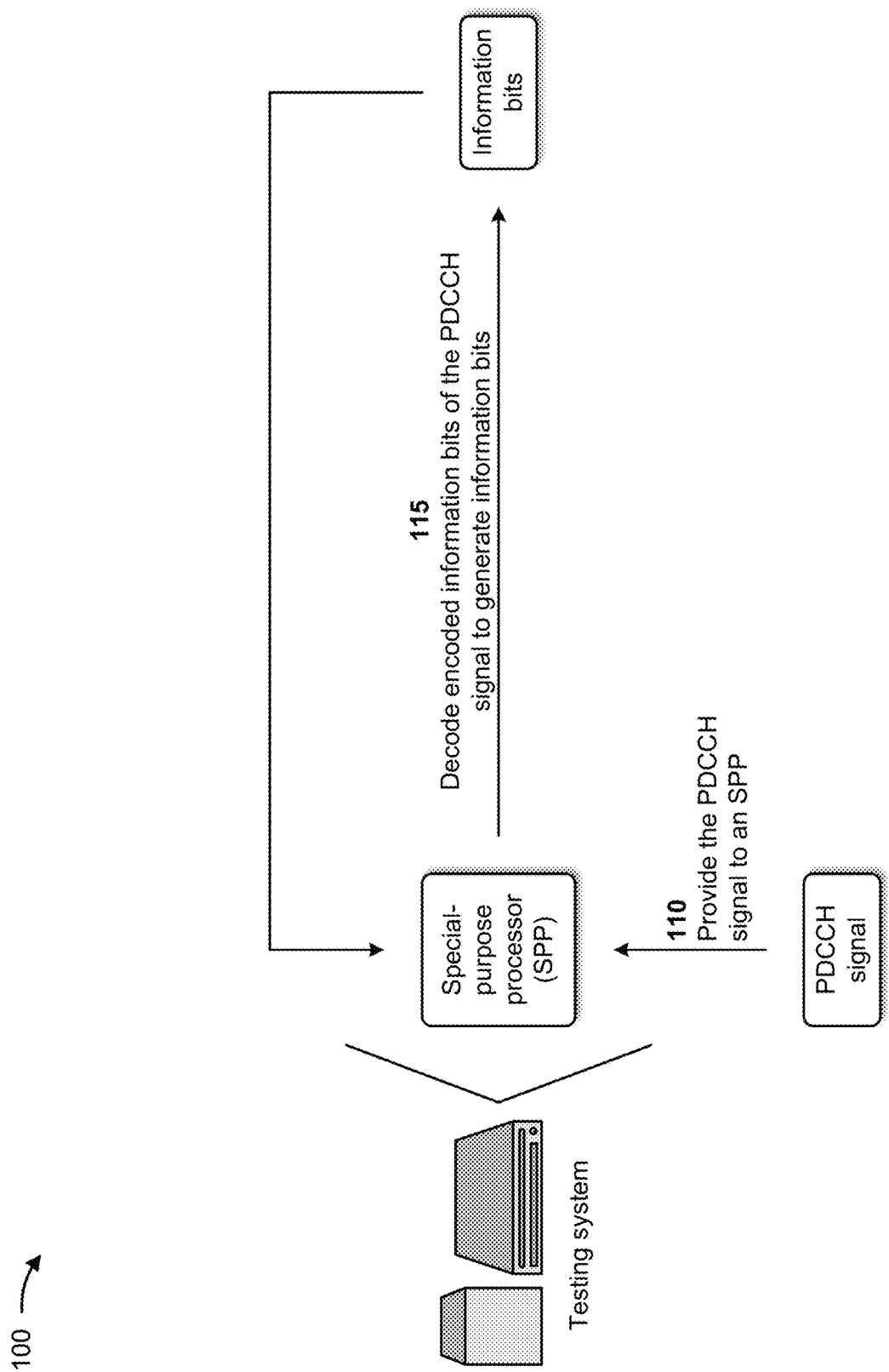

As shown in FIG. 1B, and by reference number 110, the testing system may provide the PDCCH signal to an SPP of the testing system. For example, the testing system may utilize an SPP of the testing system to decode PDCCH signals via blind detection, which is one of the most computing resource intensive and time-consuming processing tasks of the testing system. Thus, the testing system may provide the PDCCH signal to the SPP of the testing system for decoding via blind detection.

As further shown in FIG. 1B, and by reference number 115, the testing system may utilize the SPP to decode encoded information bits of the PDCCH signal to generate information bits. For example, as described above, a CCE, consisting of six REGs, is commonly used to carry the DCI. Multiple CCEs (e.g., one, two, four, eight, sixteen, and/or the like) are allocated for the PDCCH signal depending on a DCI size and channel conditions. The SPP may utilize a corresponding AL to count a quantity of the CCEs. Although the base station may fix certain CCE indices for the SPP, the SPP may fail to determine a specific index to start searching the quantity of consecutive CCEs or to identify a format if the format is decoded DCI. The SPP previously utilized multiple blindly decoding processes by combining different ALs with specific starting CCE indices and DCI formats for successful DCI decoding. In implementations described herein, the SPP may decode the encoded information bits of the PDCCH signal to generate the information bits, and may reencode and further process the information bits to reduce invalid PDCCH signals and to reduce unnecessary messaging associated with the PDCCH blind detection.

Figure 1C:
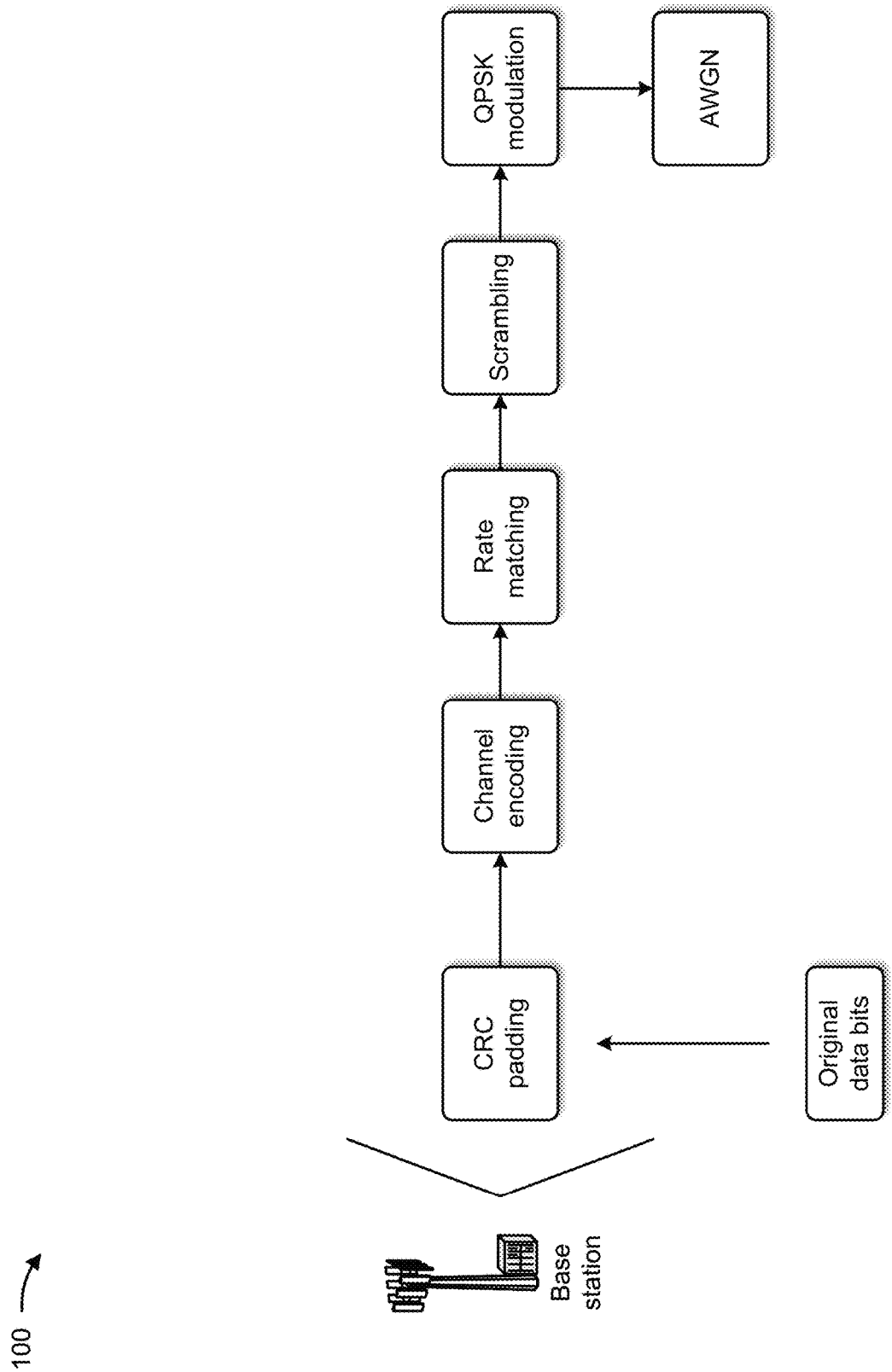

As shown in FIG. 1C, the base station may encode the information bits. For example, the base station may perform CRC padding on the original data bits. CRC padding creates information bits, which include the original data bits and CRC padded bits. After CRC padding, the base station may perform channel encoding on the information bits. Channel encoding may include converting the information bits to a coded bits by adding redundancy (e.g., so that errors caused by noise during transmission can be corrected). After channel encoding, the base station may perform rate matching on the coded bit. Rate matching may include extracting an exact set of bits to be transmitted within a given transmission time interval.

As further shown in FIG. 1C, after rate matching, the base station may perform scrambling of the coded bits. Scrambling may include removing long strings of ones and zeros from digital binary data. After scrambling, the base station may perform quadrature phase shift keying (QPSK) modulation of the coded bits. QPSK modulation may include modulating two coded bits (e.g., combined as one symbol) at once, and selecting one of the four possible carrier phase shift states. After QPSK modulation, the modulated symbols will be transmitted and an additive white Gaussian noise (AWGN) channel effect will be added on the modulated symbols that mimics an effect of random processes that occur in nature.

Figure 1D:
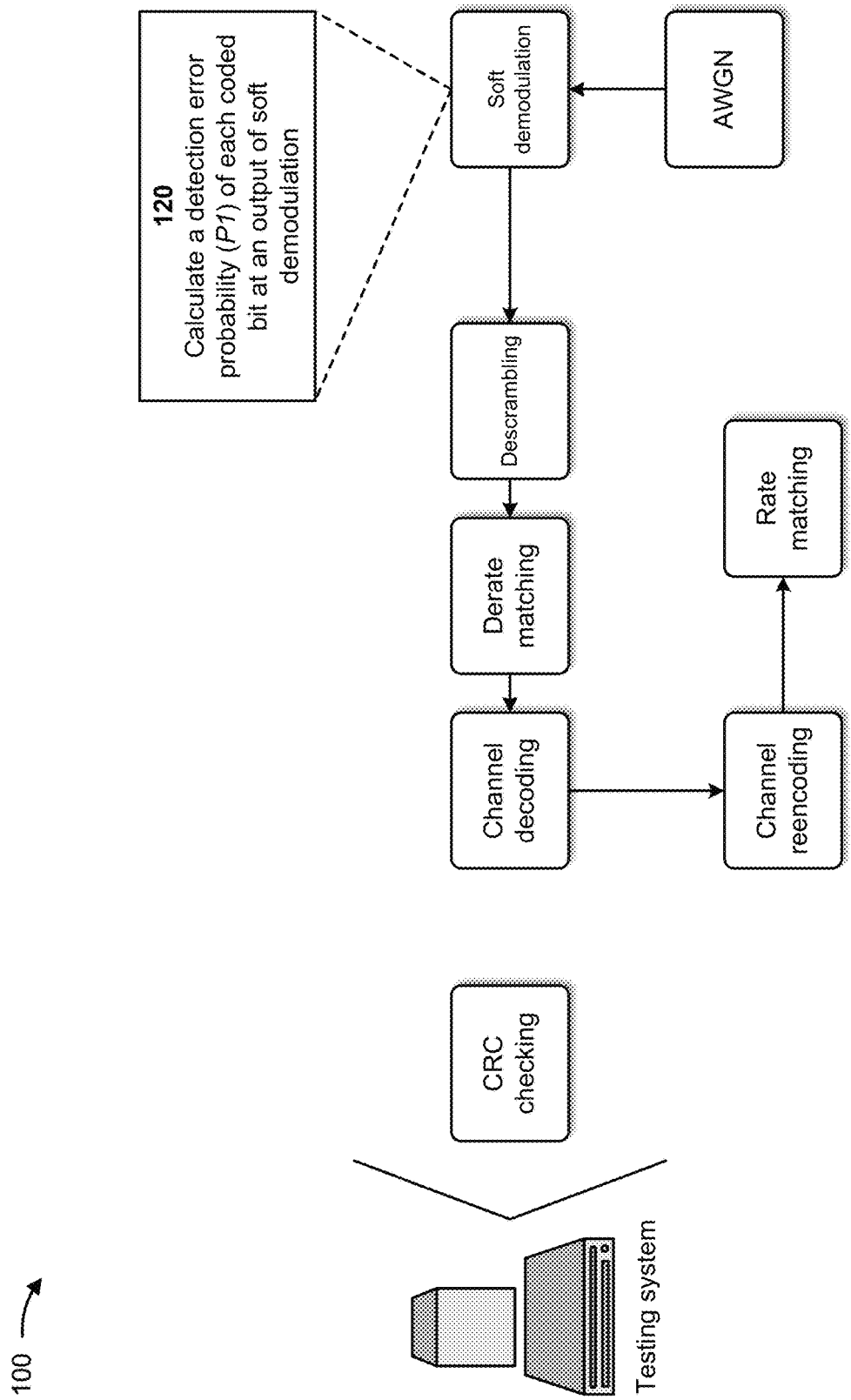

As shown in FIG. 1D, and by reference number 120, the testing system may calculate a detection error probability (P1) of each coded bit at an output of soft demodulation. For example, after processing the coded bits with the AWGN channel, the testing system may perform soft demodulation of the coded bits. Soft demodulation may include converting received symbols into soft bits, such as log likelihood ratios (LLRs). After soft demodulation, the testing system may calculate the detection error probability (P1) of each coded bit at an output of the soft demodulation.

For example, since the AWGN channel is present and QPSK modulation is used to modulate the coded bits (e.g., polar encoded bits) after rate matching and scrambling, the PDCCH signal received at the testing system may be expressed as equation (1):

$$y_l = x_l + n_l, \quad (1)$$

where $x_{l,l=1, \ldots, M_{sym}}$ is a modulated bit sequence for transmission and $M_{sym}$ is a quantity of QPSK symbols; $n_{l,l=1, \ldots, M_{sym}}$ is AWGN following complex Gaussian distribution with a zero mean and a variance $\sigma^2$ per dimension (i.e., CN (0, $2\sigma^2$)). Given $x_l$, a conditional probability density $p(y_l|x_l)$ may follow a complex Gaussian distribution with a mean $x_l$ and a variance $\sigma^2$ per dimension (i.e., CN ($x_l$, $2\sigma^2$)). The testing system may convert the complex-valued receiving signal from equation (1) to real numbers, as follows (equation (2)):

$$y_l = x_l + n_l, \quad (2)$$

where $x_l = [x_{l,real}; x_{l,imag}]$ is a column vector that includes a value of real and imaginary parts of a complex number $x_l$, i.e., $x_{l,j,j \in \{real,imag\}}$. Similar definitions apply to $y_l = [y_{l,real}; y_{l,imag}]$ and $n_l = [n_{l,real}; n_{l,imag}]$. To calculate the detection error probability P1, the testing system may determine that an all-zeros codeword is transmitted. The transmitted modulated symbol, after being converted to real numbers, can be expressed as $x_{l,j}=1, \forall l,j$. The testing system may calculate a corresponding log-likelihood ratio (LLR) for the received signal $y_{l,j}$ by equation (3):

$$LLR(y_{l,j}) = \log\frac{p(y_{l,j}|x_{l,j}=1)}{p(y_{l,j}|x_{l,j}=-1)} = \frac{2}{\sigma^2}y_{l,j}, \quad (3)$$

where $y_{l,j} \sim N(1, \sigma^2)$ and LLR $(y_{l,j}) \sim N(2/\sigma^2, 4/\sigma^2)$ Based on a probability density function of LLR $(y_{l,j})$, the testing system may calculate the detection error probability of soft demodulation on a condition of $x_{l,j}=1$ based on equation (4):

$$Pr[LLR(y_{l,j}) < 0 | x_{l,j} = 1] = \frac{1}{2}\mathrm{erfc}\left(\frac{\sqrt{2}}{2}\sigma\right), \quad (4)$$

where $\mathrm{erfc}(x) = (2/\sqrt{\pi})\int_x^\infty e^{-\theta^2}d\theta$. The testing system may perform a similar calculation for the case where an all-ones codeword is transmitted. Thus, with an assumption that $P(x_{l,j}=1) = P(x_{l,j}=-1) = 0.5$, the testing system may calculate an overall detection error probability of soft demodulation by equation (5):

$$P1_{l,j} = \frac{1}{2}Pr[LLR(y_{l,j}) < 0 | x_{l,j} = 1] + \frac{1}{2}Pr[LLR(y_{l,j}) > 0 | x_{l,j} = -1] = \\ \frac{1}{2}\mathrm{erfc}\left(\frac{\sqrt{2}}{2}\sigma\right), \forall l, j. \quad (5)$$

After calculating the detection error probability, the SPP may perform descrambling on the information bits. Descrambling may include adding long strings of ones and zeros to digital binary data. After descrambling, the SPP may perform de-rate matching on the coded bits. De-rate matching may include removing a rate-matched state from the coded bits prior to decoding of the coded bit. After de-rate matching, the SPP may perform channel decoding on the coded bits. Channel decoding may include returning binary information back to an original form by removing parity bits. After channel decoding, the GPP may perform CRC checking of the information bits. CRC checking may include detecting errors in digital data.

Figure 1E:
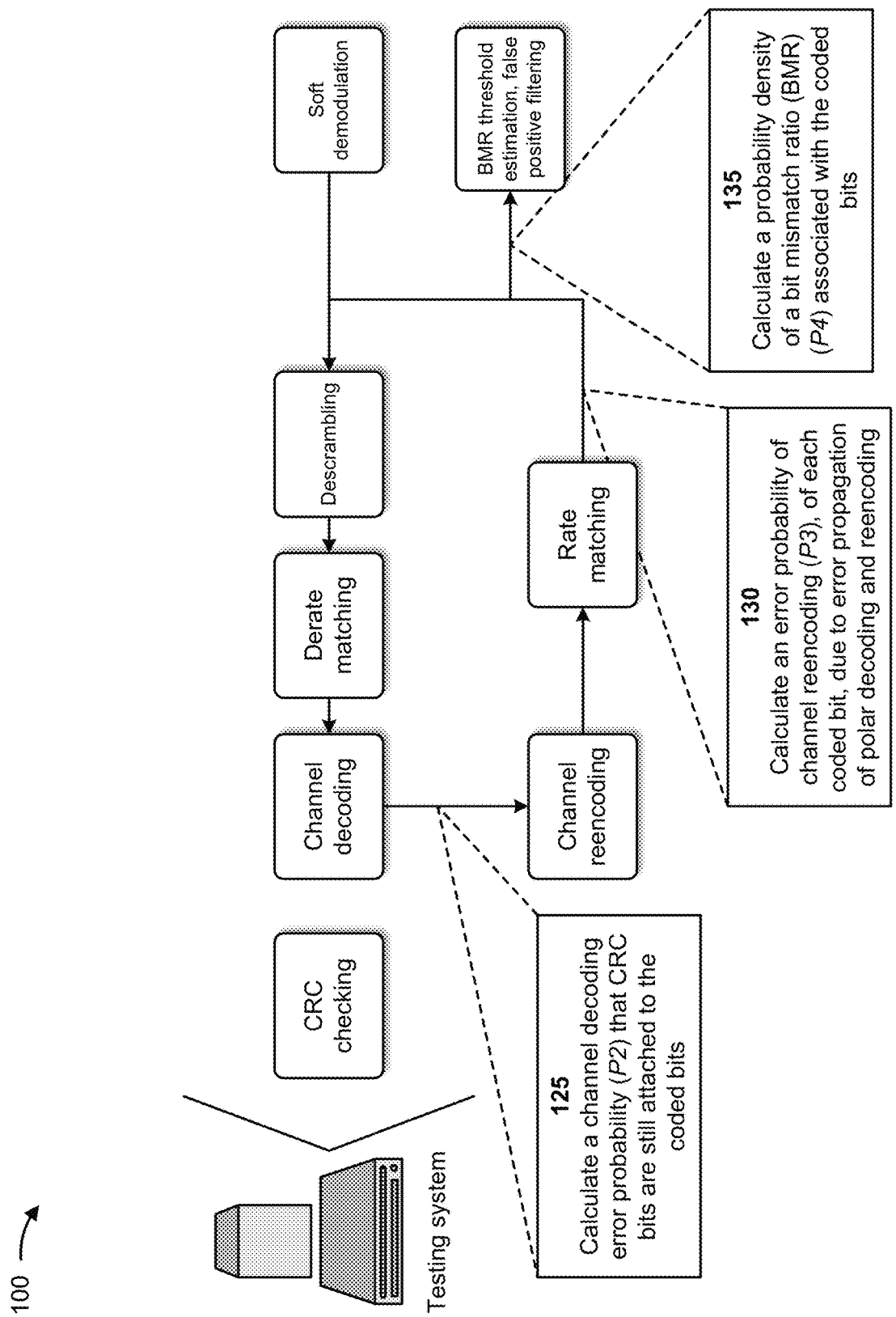

As shown in FIG. 1E, and by reference number 125, the testing system may calculate a channel decoding error probability (P2) that CRC bits are still attached to the coded bits. For example, before CRC checking, the testing system may calculate the channel decoding error probability (P2) that CRC bits are still attached to the coded bits. Polar code has been selected to generate control channels (e.g., the PDCCH) due to an ability of polar code to achieve a symmetric capacity of binary input symmetric discrete memoryless channels at a low encoding and decoding complexity. By exploiting channel polarization, the construction of polar code can rely on measurement of a parameter (e.g., a Bhattacharyya parameter) to select the most reliable bit-channels. However, calculation of a Bhattacharyya parameter for bit-channel rate and reliability may be difficult. Given a length of coded bits, e.g., $2M_{sym}$, if previous i−1 bits are decoded correctly, the SPP may determine that a probability density function of LLR after a successive-cancellation (SC) decoding process of the $i^{th}$ bit-channel can be approximated as a consistent normal density, and a corresponding decoding error probability of the $i^{th}$ decoded bit can be given by equation (6):

$$P2_i = \frac{1}{2}\mathrm{erfc}\left(\frac{1}{2}\sqrt{E\left[LLR_{2M_{Sym}}^{(i)}\right]}\right), i = 1, \ldots, 2M_{sym}, \quad (6)$$

where $LLR_{2M_{sym}}^{(i)}$ denotes an LLR of the $i^{th}$ decoded bit obtained via SC decoding process, and $E[LLR_{2M_{sym}}^{(i)}]$ denotes a mean of the LLR. After calculating the channel decoding error probability (P2) that CRC bits are still attached to the information bits, the testing system may perform channel reencoding of the coded bits. Channel reencoding may include converting the coded bits to a signal waveform in order to add redundancy to the PDCCH signal (e.g., so that errors caused by noise during transmission can be corrected). After channel reencoding, the testing system may perform rate matching on the coded bits. Rate matching may include extracting an exact set of bits to be transmitted within a given transmission time interval.

As shown in FIG. 1E, and by reference number 130, the testing system may utilize the SPP to calculate an error probability of channel reencoding (P3), of each of the coded bits, due to error propagation of polar decoding and reencoding. For example, after rate matching, the testing system may calculate the error probability of channel reencoding (P3), of each of the coded bits, due to error propagation of polar decoding and reencoding. By collecting the error probability values of K decoded information bits (i.e., $P2_{\tau, \tau \in \{1, \ldots, 2M_{sym}\}}$, from $P2_{i,\forall i}$, the testing system may calculate error probabilities of coded bits after polar reencoding based on a structure of a generator matrix G with a length $2M_{sym}$ polar code. Based on polar coding, the generator matrix G may be fixed if a codeword size is determined, and values of all frozen bits may be set to zeros. Deriving the error probability P3 may include the SPP extracting the rows of the generator matrix G with the indices of bit-channels that are used to send the K information bits. Consequently, the testing system may formulate a submatrix $\tilde{G}$ with the size of $K \times 2M_{sym}$, where K is the total number of information bits after CRC attachment. For each column of $\tilde{G}$, the testing system may extract the elements with value '1' to form an all '1's column vector $v_{i, \forall i \in \{1, \ldots, 2M_{sym}\}}$ and may log the row indices of these elements, e.g., where i is the column index of $\tilde{G}$, and $\hat{r} \in \{1, \ldots, K\}$ is equivalent to the corresponding $\hat{r}^{th}$ indexed information bit. For each coded bit $i \in \{1, \ldots, 2M_{sym}\}$, the testing system may collect the information bits with indices $\{\hat{r}\}_{i, \forall i \in \{1, \ldots, 2M_{sym}\}}$ and may form a column vector $u_{i, \forall i=1, \ldots, 2M_{sym}}$ with the size of $|\{\hat{r}\}_{i, \forall i \in \{1, \ldots, 2M_{sym}\}}|$. Here, $|\cdot|$ denotes a cardinality of a set. Thus, the $i^{th}$ reencoded bit can be formulated by equation (7):

$$\hat{x}_i = u_i^T v_i, i=1, \ldots, 2M_{sym}, \quad (7)$$

where $(\cdot)^T$ denotes a transpose of a vector.

The testing system may calculate the error probability of each reencoded bit (i.e., $x_{i, \forall i \in \{1, \ldots, 2M_{sym}\}}$) with the following three steps. First, the testing system may denote the number of elements in $v_i$ as $V_i$. The testing system may generate a set of binary vectors that consists of all possible combinations in the condition that the number of '1's in each vector is odd, and the size of each vector is equal to $V_i$. For example, if $V_i=3$, such a set of binary vectors (e.g., $v_{ij}, \forall j$) are given by $v_{i1}=[0; 0; 1]$; $v_{i2}=[0; 1; 0]$; $v_{i3}=[1; 0; 0]$; $v_{i4}=[1; 1; 1]$. In this case, there are a total of $C_i=4$ combinations of binary vectors in the set that satisfy the requirement. Second, for each $u_i$, the SPP may formulate a corresponding same size polar decoding error probability vector (e.g., $p_i$, where each element in $p_i$ holds the error probability of the corresponding information bits in $u_i$). Third, the testing system may calculate the error probability of polar reencoding of the $i^{th}$ coded bit based on equation (8):

$$P3_i = \sum_{j=1}^{C_i} prod([p_i \circ v_{ij}; (1-p_i) \circ \bar{v}_{ij}]), i=1, \ldots, 2M_{sym}, \quad (8)$$

where $prod(\cdot)$ denotes the elementwise product of a vector; $\circ$ denotes a Hadamard product of two vectors; and $\bar{v}_{ij}$ is the output of mod-2 operation of $v_{ij}$.

The method to derive $P3_{i, \forall i}$ in the above steps works fine for a small value of $V_i$ and can provide immediate results. When considering a medium or large value of $V_i$, finding all satisfied binary vectors with the theoretical method is computational infeasible, which means the SPP may resort to numerical methods. Specifically, the testing system may determine that an all-zeros codeword is transmitted. Due to the statistic property, this determination will not affect the calculation of the error probability of decoded information bits (i.e., $P2_{i, \forall i}$) or the error probability of reencoded coded bits (i.e., $P3_{i, \forall i}$). Given $P2_{i, \forall i}$ and a total number of iterations, the testing system may generate pseudorandom information bits according to the specific error probabilities $P2_{i, \forall i}$ in each iteration. The generated information bits combined with all-zeros frozen bits may be reencoded based on G to generate the reencoded bits. Then, the testing system may compare the reencoded bits with all-zero transmitted bits to mark the positions of mismatched bits. Finally, the testing system may execute multiple iterations to count the number of iterations that the bit is mismatched with each coded bit, and may calculate the error probability $P3_{i, \forall i}$ by averaging out the total number of iterations.

As further shown in FIG. 1E, and by reference number 135, the testing system may calculate a probability density of a bit mismatch ratio (BMR) (P4) associated with the coded bits. For example, after calculating the error probability (P3), the testing system may calculate the probability density of the BMR (P4) associated with the information bits. Following equation (5), the testing system may represent the bit error probability at the output of the soft demodulation module as $$P1_{i, \forall i \in \{1, \ldots, 2M_{sym}\}} = \frac{1}{2}\operatorname{erfc}\left(\frac{\sqrt{2}}{2}\sigma\right).$$

Given $P1_{i, \forall i}$ and the error probability of polar reencoding process (i.e., P3 the testing system may calculate a mismatch probability of the $i^{th}$ coded bit based on equation (9):

$$P_{BMR,i} = P1_i(1-P3_i) + (1-P1_i)P3_i, i=1, \ldots, 2M_{sym}. \quad (9)$$

With the mismatch probability, the testing system may derive the BMR threshold (i.e., $\theta_{BMR}$) by exploiting the probability that there is a total k number of mismatched coded bits, i.e., $P4_{k,k=1, \ldots, 2M_{sym}}$. Specifically, the testing system may formulate a binary matrix $B_k$ with the size of $C_{2M_{sym}}^{k} \times 2M_{sym}$, which is used to collect all combinations of positions of k number of mismatched coded bits within the total $2M_{sym}$ coded bits, i.e., $C_{2M_{sym}}^{k}$. For example, if k=2 and $M_{sym}=2$, the binary matrix $B_k=[1\ 1\ 0\ 0;\ 1\ 0\ 1\ 0;\ 1\ 0\ 0\ 1;\ 0\ 1\ 0\ 1;\ 0\ 1\ 1\ 0;\ 0\ 0\ 1\ 1]$, where "1" denotes the coded bit that is mismatched, otherwise it is "0." Given $P_{BMR,i, \forall i}$, the testing system may formulate a probability vector $p_{miss} = [P_{BMR,1}, P_{BMR,2}, P_{BMR,2M_{sym}}]$ to collect the mismatch probability of all coded bits. Then, the testing system may calculate the probability that there is a total k number of mismatched coded bits based on equation (10):

$$P4_k = \sum_{i=1}^{C_{2M_{sym}}^k} prod([p_{miss} \circ b_{k,i}; (1-p_{miss}) \circ \bar{b}_{k,i}]) k=1, \ldots, 2M_{sym} \quad (10)$$

where $b_{k,i}$ denotes the $i^{th}$ row of the binary matrix $B_k$ and $\bar{b}_{k,i}$ is the output of mod-2 operation of $b_{k,i}$. The BMR threshold $\theta_{BMR}$ for filtering the invalid PDCCH candidates may be equal to $P4_{k^*}$, where $k^*$ is the number of mismatched coded bits that its corresponding probability $P4_{k^*} > \varepsilon$ and $P4_{k^*+1} \leq \varepsilon$, and where E is a small constant number. If there is no $k^*$ that makes $P4_{k^*+1} \leq \varepsilon$, $k^*$ will be equal to $2M_{sym}$.

Similar to the way of calculating error probability of reencoded bits $P3_{i,\forall i}$, the formulation of binary matrix $B_k$ may also be computationally infeasible if CN and/or $2M_{sym}$ have a medium or large value. In this case, the testing system may utilize a numerical method to assist in calculating $P4_{k,\forall k}$. Specifically, given $P_{BMRi,\forall i}$ and the total number of iterations, the testing system may generate pseudorandom '1's for each coded bit based on the mismatch probabilities $P_{BMRi,\forall i}$ in each iteration. The testing system may calculate the BMR in this iteration by summing up all '1's and dividing the sum by $2M_{sym}$. The testing system may execute multiple iterations to count the number of iterations with mismatched bits that correspond to a specific BMR value, and may calculate the probability $P4_{k,\forall k}$ by averaging out the total number of iterations.

Figure 1F:
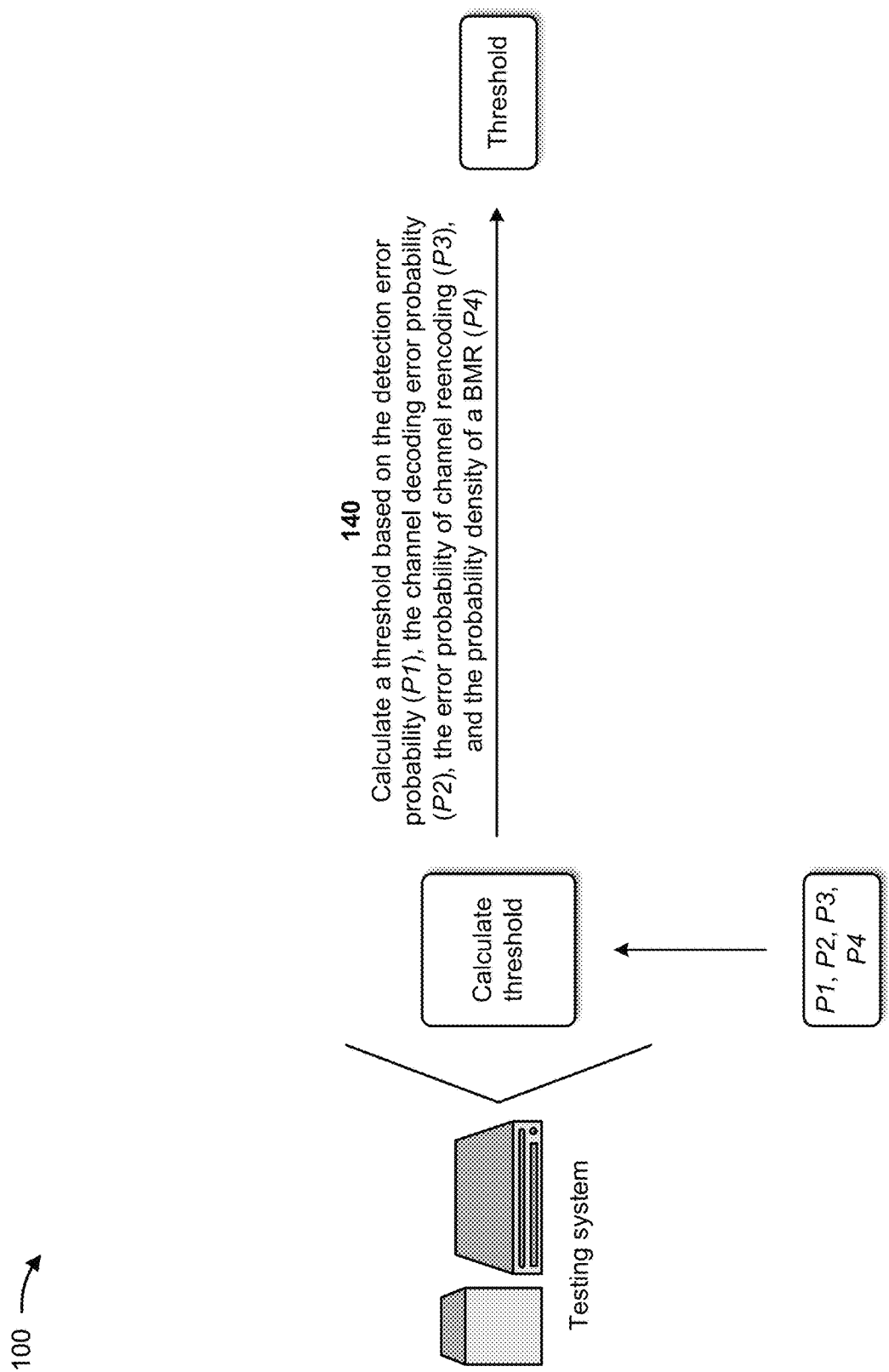

As shown in FIG. 1F, and by reference number 140, the testing system may calculate a threshold based on the detection error probability (P1), the channel decoding error probability (P2), the error probability of channel reencoding (P3), and the probability density of a bit mismatch ratio (P4). For example, the threshold may be utilized to determine whether the PDCCH signal is valid or invalid. The testing system may calculate the threshold based on one or more of the detection error probability (P1), the channel decoding error probability (P2), the error probability of channel reencoding (P3), and/or the probability density of a bit mismatch ratio (P4). In some implementations, the testing system may utilize the detection error probability (P1), the channel decoding error probability (P2), and the error probability of channel reencoding (P3) to calculate the probability density of a bit mismatch ratio (P4), and the probability density (P4) may correspond to the threshold.

Figure 1G:
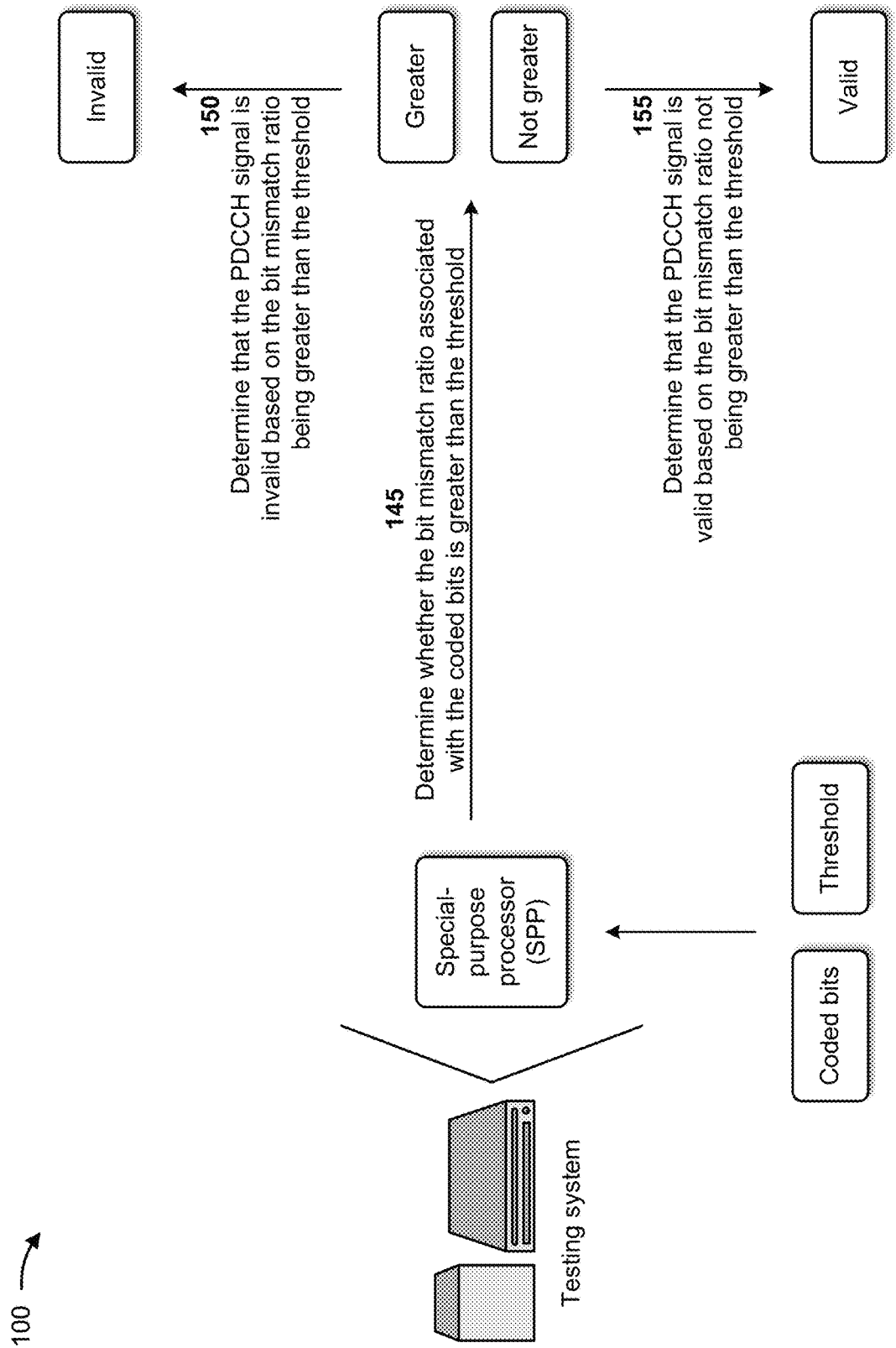

As shown in FIG. 1G, and by reference number 145, the testing system may utilize the SPP to determine whether the BMR associated with the information bits is greater than the threshold. For example, the SPP may compare the BMR (e.g., associated with the information bits) and the threshold to determine whether the BMR is greater than the threshold. In some implementations, the SPP may determine that the BMR is greater than the threshold. Alternatively, the SPP may determine that the BMR is not greater than the threshold.

As further shown in FIG. 1G, and by reference number 150, the testing system may utilize the SPP to determine that the PDCCH signal is invalid based on the bit mismatch ratio being greater than the threshold. For example, when the SPP determines that the BMR is greater than the threshold, the SPP may determine that the PDCCH signal is invalid based on the BMR being greater than the threshold. In some implementations, when the SPP determines that the PDCCH signal is invalid, the SPP may discard the information bits (e.g., the PDCCH signal) based on determining that the PDCCH signal is invalid.

As further shown in FIG. 1G, and by reference number 155, the testing system may utilize the SPP to determine that the PDCCH signal is valid based on the bit mismatch ratio not being greater than the threshold. For example, when the SPP determines that the BMR is not greater than the threshold, the SPP may determine that the PDCCH signal is valid based on the bit mismatch ratio not being greater than the threshold.

Figure 1H:
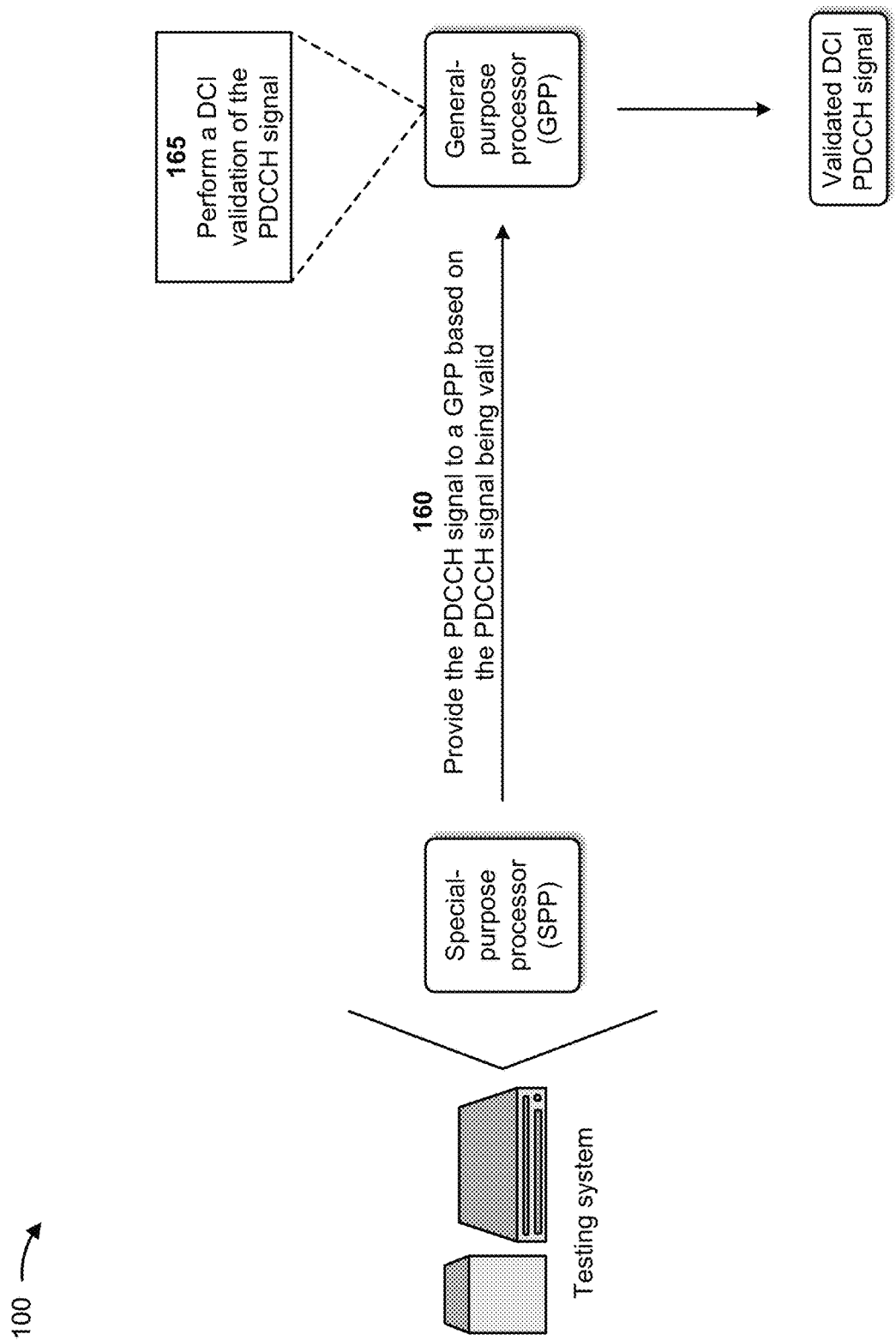

As shown in FIG. 1H, and by reference number 160, the testing system may cause the SPP to provide the decoded bits (e.g., PDCCH signal) to a GPP of the testing system, based on the PDCCH signal being valid. For example, when the SPP determines that the PDCCH signal is valid, the SPP may provide the PDCCH signal to the GPP of the testing system based on the PDCCH signal being valid.

As further shown in FIG. 1H, and by reference number 165, the testing system may utilize the GPP to perform a DCI validation of the PDCCH signal. For example, when the GPP receives the PDCCH signal from the SPP, the GPP may perform DCI validation of the PDCCH signal. In some implementations, the GPP may perform RNTI demasking on the PDCCH signal, may perform a 24-bit CRC checking of the PDCCH signal, and/or the like for the DCI validation.

In this way, the testing system performs channel reencoding to reduce invalid PDCCH signals. The testing system may utilize a reencoding method to reduce a quantity of invalid PDCCH candidates before RNTI demasking and CRC checking for DCI verification, which reduces a quantity of messages passed between the SPP and the GPP and improves the blind PDCCH detection efficiency and reliability. The testing system may reencode polar decoded bits before DCI validation (e.g., the RNTI demasking and the CRC checking), and may compare the reencoded bits with a probability density of a bit mismatch ratio (BMR). If the probability density of the BMR is greater than a threshold, the testing system may consider the decoded bits an invalid PDCCH candidate. This, in turn, conserves computing resources, networking resources, and/or the like that would otherwise have been consumed in utilizing the computationally intensive PDCCH blind detection, creating unnecessary messaging with the PDCCH blind detection, and/or the like.

As indicated above, FIGS. 1A-1H are provided as an example. Other examples may differ from what is described with regard to FIGS. 1A-1H. The number and arrangement of devices shown in FIGS. 1A-1H are provided as an example. In practice, there may be additional devices, fewer devices, different devices, or differently arranged devices than those shown in FIGS. 1A-1H. Furthermore, two or more devices shown in FIGS. 1A-1H may be implemented within a single device, or a single device shown in FIGS. 1A-1H may be implemented as multiple, distributed devices. Additionally, or alternatively, a set of devices (e.g., one or more devices) shown in FIGS. 1A-1H may perform one or more functions described as being performed by another set of devices shown in FIGS. 1A-1H.

Figure 2:
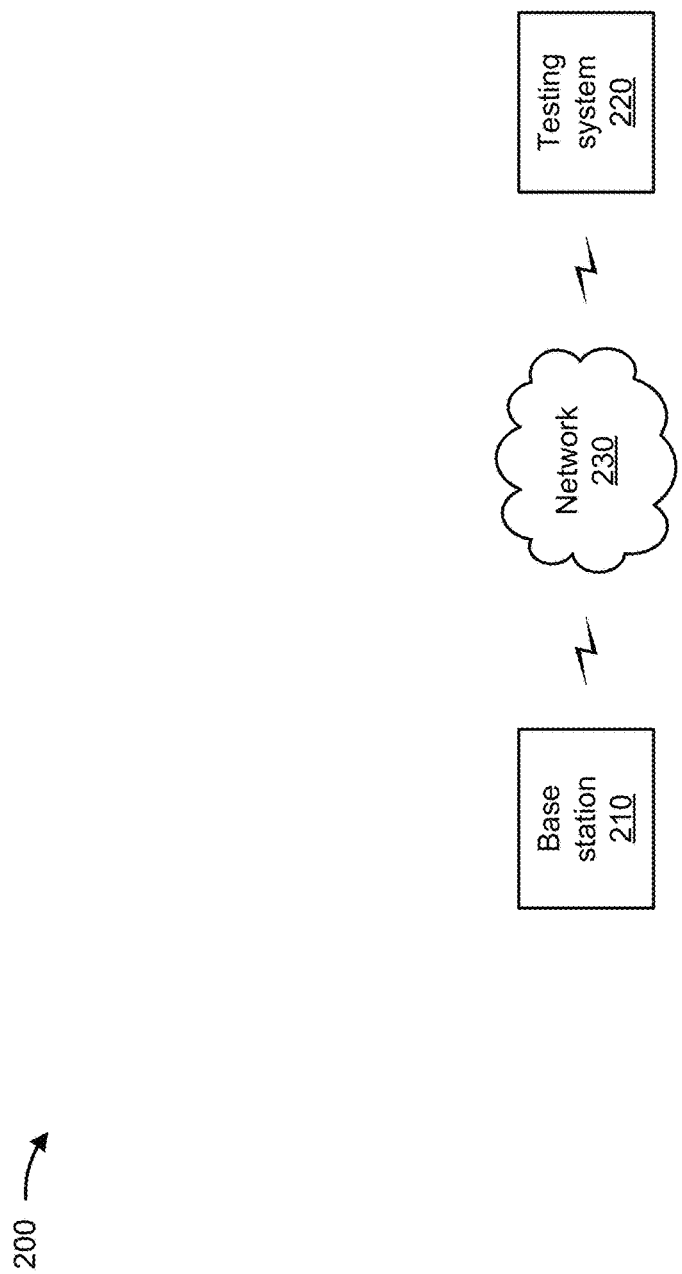
FIG. 2 is a diagram of an example environment in which systems and/or methods described herein may be implemented.

FIG. 2 is a diagram of an example environment 200 in which systems and/or methods described herein may be implemented. As shown in FIG. 2, the environment 200 may include a base station 210, a testing system 220, and/or a network 230. Devices and/or elements of the environment 200 may interconnect via wired connections and/or wireless connections.

The base station 210 may support, for example, a cellular radio access technology (RAT). The base station 210 may include one or more base stations (e.g., base transceiver stations, radio base stations, node Bs, eNodeBs (eNBs), gNodeBs (gNBs), base station subsystems, cellular sites, cellular towers, access points, transmit receive points (TRPs), radio access nodes, macrocell base stations, microcell base stations, picocell base stations, femtocell base stations, or similar types of devices) and other network entities that can support wireless communication for a user equipment (UE). The base station 210 may transfer traffic between a UE (e.g., using a cellular RAT), one or more base stations (e.g., using a wireless interface or a backhaul interface, such as a wired backhaul interface), and/or a core network. The base station 210 may provide one or more cells that cover geographic areas.

In some implementations, the base station 210 may perform scheduling and/or resource management for a UE covered by the base station 210 (e.g., a UE covered by a cell provided by the base station 210). In some implementations, the base station 210 may be controlled or coordinated by a network controller, which may perform load balancing, network-level configuration, and/or other operations. The network controller may communicate with the base station 210 via a wireless or wireline backhaul. In some implementations, the base station 210 may include a network controller, a self-organizing network (SON) module or component, or a similar module or component. In other words, the base station 210 may perform network control, scheduling, and/or network management functions (e.g., for uplink, downlink, and/or sidelink communications of a UE covered by the base station 210).

The testing system 220 may include one or more devices capable of receiving, generating, storing, processing, and/or providing information, as described elsewhere herein. The testing system 220 may include a communication device and/or a computing device. For example, the testing system 220 may be utilized for functional testing, system integration testing, capacity testing, and stress testing of multiple cells (e.g., provided by the base stations 210), and may emulate thousands of UEs. In some implementations, the testing system 220 may emulate wireless communication devices, mobile phones, laptop computers, tablet computers, desktop computers, gaming consoles, set-top boxes, wearable communication devices (e.g., smart wristwatches, smart eyeglasses, head mounted displays, or virtual reality headsets), or similar types of devices.

The network 230 may include one or more wired and/or wireless networks. For example, the network 230 may include a cellular network (e.g., a fifth generation (5G) network, a fourth generation (4G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or a combination of these or other types of networks. The network 230 enables communication among the devices of environment 200.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the environment 200 may perform one or more functions described as being performed by another set of devices of the environment 200.

Figure 3:
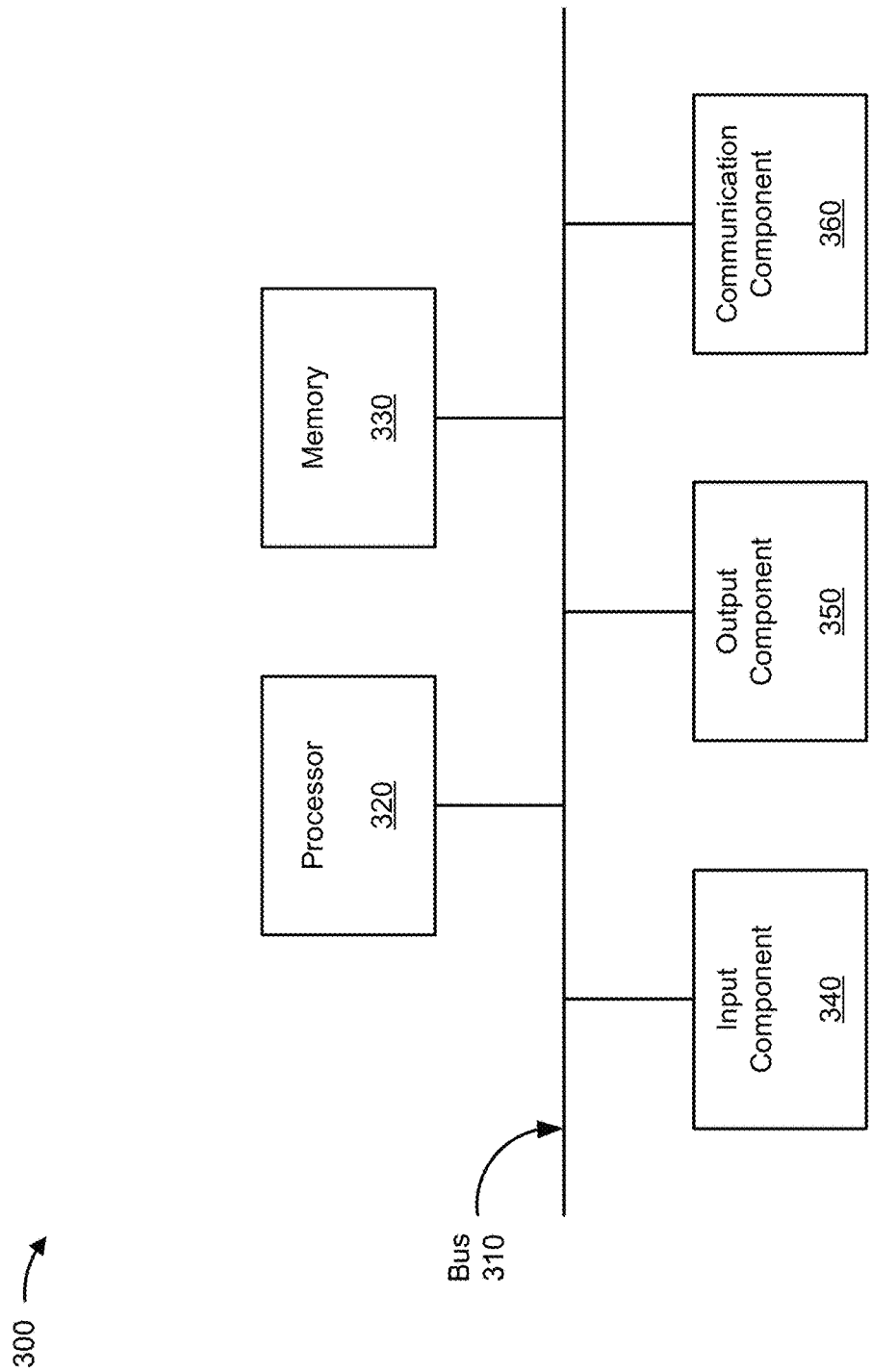
FIG. 3 is a diagram of example components of one or more devices of FIG. 2.

FIG. 3 is a diagram of example components of a device 300, which may correspond to the base station 210 and/or the testing system 220. In some implementations, the base station 210 and/or the testing system 220 may include one or more devices 300 and/or one or more components of the device 300. As shown in FIG. 3, the device 300 may include a bus 310, a processor 320, a memory 330, an input component 340, an output component 350, and a communication interface 360.

The bus 310 includes one or more components that enable wired and/or wireless communication among the components of the device 300. The bus 310 may couple together two or more components of FIG. 3, such as via operative coupling, communicative coupling, electronic coupling, and/or electric coupling. The processor 320 includes a central processing unit, a graphics processing unit, a microprocessor, a controller, a microcontroller, a digital signal processor, a field-programmable gate array, an application-specific integrated circuit, and/or another type of processing component. The processor 320 is implemented in hardware, firmware, or a combination of hardware and software. In some implementations, the processor 320 includes one or more processors capable of being programmed to perform one or more operations or processes described elsewhere herein.

The memory 330 includes volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 stores information, instructions, and/or software (e.g., one or more software applications) related to the operation of the device 300. In some implementations, the memory 330 includes one or more memories that are coupled to one or more processors (e.g., the processor 320), such as via the bus 310.

The input component 340 enables the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 enables the device 300 to provide output, such as via a display, a speaker, and/or a light-emitting diode. The communication interface 360 enables the device 300 to communicate with other devices via a wired connection and/or a wireless connection. For example, the communication interface 360 may include a receiver, a transmitter, a transceiver, a modem, a network interface card, and/or an antenna.

The device 300 may perform one or more operations or processes described herein. For example, a non-transitory computer-readable medium (e.g., the memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hard-wired circuitry may be used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

FIG. 4 is a flowchart of an example process 400 for channel reencoding to reduce invalid PDCCH signals. In some implementations, one or more process blocks of FIG. 4 may be performed by a device (e.g., the testing system 220). In some implementations, one or more process blocks of FIG. 4 may be performed by another device or a group of devices separate from or including the device. Additionally, or alternatively, one or more process blocks of FIG. 4 may be performed by one or more components of the device 300, such as the processor 320, the memory 330, the input component 340, the output component 350, and/or the communication interface 360.

As shown in FIG. 4, process 400 may include receiving a physical downlink control channel (PDCCH) signal from a base station (block 405). For example, the device may receive a PDCCH signal from a base station, as described above. In some implementations, the device is a multi-user-equipment emulator testing device.

As further shown in FIG. 4, process 400 may include providing the PDCCH signal to a special-purpose processor of the device (block 410). For example, the device may provide the PDCCH signal to a special-purpose processor of the device, as described above.

As further shown in FIG. 4, process 400 may include decoding encoded bits of the PDCCH signal to generate coded bits (block 415). For example, the device may decode encoded bits of the PDCCH signal to generate coded bits, as described above.

As further shown in FIG. 4, process 400 may include reencoding the coded bits (block 420). For example, the device may reencode the coded bits, as described above.

As further shown in FIG. 4, process 400 may include calculating a detection error probability of each coded bit at an output of soft demodulation (block 425). For example, the device may calculate a detection error probability of each coded bit at an output of soft demodulation, as described above. In some implementations, calculating the detection error probability of each coded bit at the output of soft demodulation includes generating a column vector based on the coded bits, calculating a log-likelihood of the column vector to generate a log-likelihood result, and calculating a probability density function of the log-likelihood result to generate the detection error probability.

As further shown in FIG. 4, process 400 may include calculating a channel decoding error probability that cyclic redundancy check bits are still attached to the coded bits (block 430). For example, the device may calculate a channel decoding error probability that cyclic redundancy check bits are still attached to the coded bits, as described above. In some implementations, calculating the channel decoding error probability that cyclic redundancy check bits are still attached to the coded bits includes utilizing a Gaussian approximation to calculate the channel decoding error probability.

As further shown in FIG. 4, process 400 may include calculating an error probability of channel reencoding, of each coded bit of the coded bits, due to error propagation of polar decoding and reencoding (block 435). For example, the device may calculate an error probability of channel reencoding, of each coded bit of the coded bits, due to error propagation of polar decoding and reencoding, as described above. In some implementations, calculating the error probability of channel reencoding, of each coded bit of the coded bits, due to error propagation of polar decoding and reencoding includes creating a generator matrix based on the coded bits, extracting rows from the generator matrix to create a submatrix, and calculating the error probability of channel reencoding based on the submatrix.

As further shown in FIG. 4, process 400 may include calculating a probability density of a bit mismatch ratio associated with the coded bits (block 440). For example, the device may calculate a probability density of a bit mismatch ratio associated with the coded bits, as described above. In some implementations, calculating the probability density of the bit mismatch ratio associated with the coded bits includes creating a binary matrix based on the coded bits, and calculating the probability density based on the binary matrix. In some implementations, calculating the probability density of the bit mismatch ratio associated with the coded bits includes calculating the probability density of the bit mismatch ratio based on the detection error probability, the channel decoding error probability, and the error probability of channel reencoding, wherein the probability density corresponds to the threshold.

As further shown in FIG. 4, process 400 may include calculating a threshold based on the detection error probability, the channel decoding error probability, the error probability of channel reencoding, and the probability density of a bit mismatch ratio (block 445). For example, the device may calculate a threshold based on the detection error probability, the channel decoding error probability, the error probability of channel reencoding, and the probability density of a bit mismatch ratio, as described above. In some implementations, the threshold is a bit mismatch ratio threshold.

As further shown in FIG. 4, process 400 may include determining whether the bit mismatch ratio associated with the coded bits is greater than the threshold (block 450). For example, the device may determine whether the bit mismatch ratio associated with the coded bits is greater than the threshold, as described above.

As further shown in FIG. 4, process 400 may include performing one or more actions based on determining whether the bit mismatch ratio associated with the coded bits is greater than the threshold (block 455). For example, the device may perform one or more actions based on determining whether the bit mismatch ratio associated with the coded bits is greater than the threshold, as described above. In some implementations, performing the one or more actions includes determining that the PDCCH signal is invalid based on the bit mismatch ratio being greater than the threshold. In some implementations, process 400 includes discarding the coded bits based on determining that the PDCCH signal is invalid.

In some implementations, performing the one or more actions includes determining that the PDCCH signal is valid based on the bit mismatch ratio not being greater than the threshold. In some implementations, process 400 includes causing the special-purpose processor to provide the PDCCH signal to a general-purpose processor of the device, based on the PDCCH signal being valid, and causing the general-purpose processor to perform a downlink control information validation of the PDCCH signal. In some implementations, the downlink control information validation of the PDCCH signal includes radio network temporary identifier demasking and cyclic redundancy check checking of the PDCCH signal.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, and/or the like, depending on the context.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
   receiving, by a device, a physical downlink control channel (PDCCH) signal from a base station;
   providing, by the device, the PDCCH signal to a special-purpose processor of the device;
   decoding, by the special-purpose processor, encoded bits of the PDCCH signal to generate coded bits;
   reencoding, by the special-purpose processor, the coded bits;
   calculating, by the device, a detection error probability of each coded bit at an output of soft demodulation;
   calculating, by the device, a channel decoding error probability that cyclic redundancy check bits are still attached to the coded bits;
   calculating, by the device, an error probability of channel reencoding, of each coded bit of the coded bits, due to error propagation of polar decoding and reencoding;
   calculating, by the device, a probability density of a bit mismatch ratio associated with the coded bits;
   calculating, by the device, a threshold based on the detection error probability, the channel decoding error probability, the error probability of channel reencoding, and the probability density of a bit mismatch ratio;
   determining, by the special-purpose processor, whether the bit mismatch ratio associated with the coded bits is greater than the threshold; and
   performing, by the device, one or more actions based on determining whether the bit mismatch ratio associated with the coded bits is greater than the threshold.

2. The method of claim 1, wherein performing the one or more actions comprises:
   determining that the PDCCH signal is invalid based on the bit mismatch ratio being greater than the threshold.

3. The method of claim 2, further comprising:
   discarding the coded bits based on determining that the PDCCH signal is invalid.

4. The method of claim 1, wherein performing the one or more actions comprises:
   determining that the PDCCH signal is valid based on the bit mismatch ratio not being greater than the threshold.

5. The method of claim 4, further comprising:
   causing the special-purpose processor to provide the PDCCH signal to a general-purpose processor of the device, based on the PDCCH signal being valid; and
   causing the general-purpose processor to perform a downlink control information validation of the PDCCH signal.

6. The method of claim 5, wherein the downlink control information validation of the PDCCH signal includes radio network temporary identifier demasking and cyclic redundancy check checking of the PDCCH signal.

7. The method of claim 1, wherein calculating the detection error probability of each coded bit at the output of soft demodulation comprises:
   generating a column vector based on the coded bits;
   calculating a log-likelihood of the column vector to generate a log-likelihood result; and
   calculating a probability density function of the log-likelihood result to generate the detection error probability.

8. A device, comprising:
one or more memories; and
one or more processors, coupled to the one or more memories, configured to:
receive a physical downlink control channel (PDCCH) signal from a base station;
provide the PDCCH signal to a special-purpose processor of the device;
decode encoded bits of the PDCCH signal to generate coded bits;
reencode the coded bits;
calculate a detection error probability of each coded bit at an output of soft demodulation;
calculate a channel decoding error probability that cyclic redundancy check bits are still attached to the coded bits;
calculate an error probability of channel reencoding, of each coded bit of the coded bits, due to error propagation of polar decoding and reencoding;
calculate a probability density of a bit mismatch ratio associated with the coded bits;
calculate a threshold based on the detection error probability, the channel decoding error probability, the error probability of channel reencoding, and the probability density of a bit mismatch ratio;
determine whether the bit mismatch ratio associated with the coded bits is greater than the threshold;
determine that the PDCCH signal is invalid based on the bit mismatch ratio being greater than the threshold; and
discard the coded bits based on determining that the PDCCH signal is invalid.

9. The device of claim 8, wherein the one or more processors, to calculate the channel decoding error probability that cyclic redundancy check bits are still attached to the coded bits, are configured to:
utilize a Gaussian approximation to calculate the channel decoding error probability.

10. The device of claim 8, wherein the one or more processors, to calculate the error probability of channel reencoding, of each coded bit of the coded bits, due to error propagation of polar decoding and reencoding, are configured to:
create a generator matrix based on the coded bits;
extract rows from the generator matrix to create a submatrix; and
calculate the error probability of channel reencoding based on the submatrix.

11. The device of claim 8, wherein the one or more processors, to calculate the probability density of the bit mismatch ratio associated with the coded bits, are configured to:
create a binary matrix based on the coded bits; and
calculate the probability density based on the binary matrix.

12. The device of claim 8, wherein the one or more processors, to calculate the probability density of the bit mismatch ratio associated with the coded bits, are configured to:
calculate the probability density of the bit mismatch ratio based on the detection error probability, the channel decoding error probability, and the error probability of channel reencoding,
wherein the probability density corresponds to the threshold.

13. The device of claim 8, wherein the threshold is a bit mismatch ratio threshold.

14. The device of claim 8, wherein the device is a multi-user-equipment emulator testing device.

15. A non-transitory computer-readable medium storing a set of instructions, the set of instructions comprising:
one or more instructions that, when executed by one or more processors of a device, cause the device to:
receive a physical downlink control channel (PDCCH) signal from a base station;
provide the PDCCH signal to a special-purpose processor of the device;
decode encoded bits of the PDCCH signal to generate coded bits;
reencode the coded bits;
calculate a detection error probability of each coded bit at an output of soft demodulation;
calculate a channel decoding error probability that cyclic redundancy check bits are still attached to the coded bits;
calculate an error probability of channel reencoding, of each coded bit of the coded bits, due to error propagation of polar decoding;
calculate a probability density of a bit mismatch ratio associated with the coded bits based on the detection error probability, the channel decoding error probability, and the error probability of channel reencoding,
wherein the probability density corresponds to a threshold;
determine whether the bit mismatch ratio associated with the coded bits is greater than the threshold; and
perform one or more actions based on determining whether the bit mismatch ratio associated with the coded bits is greater than the threshold.

16. The non-transitory computer-readable medium of claim 15, wherein the one or more instructions, that cause the device to perform the one or more actions, cause the device to:
determine that the PDCCH signal is invalid based on the bit mismatch ratio being greater than the threshold; and
discard the coded bits based on determining that the PDCCH signal is invalid.

17. The non-transitory computer-readable medium of claim 15, wherein the one or more instructions, that cause the device to perform the one or more actions, cause the device to:
determine that the PDCCH signal is valid based on the bit mismatch ratio not being greater than the threshold;
cause the special-purpose processor to provide the PDCCH signal to a general-purpose processor of the device, based on the PDCCH signal being valid; and
cause the general-purpose processor to perform a downlink control information validation of the PDCCH signal,
wherein the downlink control information validation of the PDCCH signal includes radio network temporary identifier demasking and cyclic redundancy check checking of the PDCCH signal.

18. The non-transitory computer-readable medium of claim 15, wherein the one or more instructions, that cause the device to calculate the detection error probability of each coded bit at the output of soft demodulation, cause the device to:
generating a column vector based on the coded bits;
calculate a log-likelihood of the column vector to generate a log-likelihood result; and
calculate a probability density function of the log-likelihood result to generate the detection error probability.

19. The non-transitory computer-readable medium of claim 15, wherein the one or more instructions, that cause the device to calculate the channel decoding error probability that cyclic redundancy check bits are still attached to the coded bits, cause the device to:
  utilize a Gaussian approximation to calculate the channel decoding error probability.

20. The non-transitory computer-readable medium of claim 15, wherein the one or more instructions, that cause the device to calculate the error probability of channel reencoding, of each coded bit of the coded bits, due to error propagation of polar decoding and reencoding, cause the device to:
  create a generator matrix based on the coded bits;
  extract rows from the generator matrix to create a submatrix; and
  calculate the error probability based on the submatrix.

* * * * *